(12) United States Patent
Jiang et al.

(10) Patent No.: US 9,735,539 B2
(45) Date of Patent: Aug. 15, 2017

(54) VCSEL STRUCTURE WITH EMBEDDED HEAT SINK

(71) Applicant: APPLE INC., Cupertino, CA (US)

(72) Inventors: Tongbi T. Jiang, Cupertino, CA (US); Weiping Li, Cupertino, CA (US); Xiaofeng Fan, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/011,562

(22) Filed: Jan. 31, 2016

(65) Prior Publication Data

US 2017/0025815 A1  Jan. 26, 2017

Related U.S. Application Data

(60) Provisional application No. 62/194,298, filed on Jul. 20, 2015.

(51) Int. Cl.
| | |
|---|---|
| *H01S 5/024* | (2006.01) |
| *H01S 5/183* | (2006.01) |
| *H01S 5/42* | (2006.01) |
| *H01S 5/042* | (2006.01) |

(52) U.S. Cl.
CPC ........ *H01S 5/02469* (2013.01); *H01S 5/0425* (2013.01); *H01S 5/183* (2013.01); *H01S 5/423* (2013.01)

(58) Field of Classification Search
CPC ..... H01S 5/02469; H01S 5/0425; H01S 5/183
See application file for complete search history.

(56) References Cited

U.S. PATENT DOCUMENTS

| | | | | |
|---|---|---|---|---|
| 4,069,463 | A | * | 1/1978 | McGroddy ........... H01S 5/4025 257/506 |
| 5,812,571 | A | | 9/1998 | Peters |
| 6,156,980 | A | | 12/2000 | Peugh et al. |
| 6,597,713 | B2 | | 7/2003 | Ouchi |
| 6,674,948 | B2 | | 1/2004 | Yeh et al. |
| 6,936,855 | B1 | | 8/2005 | Harrah |
| 7,126,218 | B1 | | 10/2006 | Darveaux et al. |
| 7,271,461 | B2 | | 9/2007 | Dutta |
| 7,303,005 | B2 | | 12/2007 | Reis et al. |
| 7,800,067 | B1 | | 9/2010 | Rajavel et al. |
| 7,949,024 | B2 | | 5/2011 | Joseph |
| 8,193,482 | B2 | | 6/2012 | Itsler |
| 8,259,293 | B2 | | 9/2012 | Andreou |
| 8,275,270 | B2 | | 9/2012 | Shushakov et al. |

(Continued)

OTHER PUBLICATIONS

Charbon et al., "SPAD-Based Sensors", TOF Range-Imaging Cameras, Springer-Verlag, pp. 11-38, year 2013.

(Continued)

*Primary Examiner* — Dung Nguyen
(74) *Attorney, Agent, or Firm* — D. Klingler IP Services Ltd.

(57) ABSTRACT

An optoelectronic device includes a semiconductor substrate, having front and back sides and having at least one cavity extending from the back side through the semiconductor substrate into proximity with the front side. At least one optoelectronic emitter is formed on the front side of the semiconductor substrate in proximity with the at least one cavity. A heat-conducting material at least partially fills the at least one cavity and is configured to serve as a heat sink for the at least one optoelectronic emitter.

18 Claims, 4 Drawing Sheets

(56) References Cited

U.S. PATENT DOCUMENTS

| | | |
|---|---|---|
| 8,355,117 B2 | 1/2013 | Niclass |
| 8,405,020 B2 | 3/2013 | Menge |
| 8,604,603 B2 | 12/2013 | Lau et al. |
| 8,766,164 B2 | 7/2014 | Sanfilippo et al. |
| 8,963,069 B2 | 2/2015 | Drader et al. |
| 9,024,246 B2 | 5/2015 | Jiang et al. |
| 9,052,356 B2 | 6/2015 | Chu et al. |
| 9,076,707 B2 | 7/2015 | Harmon |
| 9,106,849 B2 | 8/2015 | Duggal et al. |
| 2002/0070443 A1 | 6/2002 | Mu et al. |
| 2002/0127752 A1* | 9/2002 | Thompson ............ B82Y 20/00 438/22 |
| 2003/0081385 A1 | 5/2003 | Mochizuki et al. |
| 2004/0001317 A1 | 1/2004 | Getz, Jr. et al. |
| 2007/0262441 A1 | 11/2007 | Chen |
| 2013/0015331 A1 | 1/2013 | Birk et al. |
| 2013/0163627 A1* | 6/2013 | Seurin ................... H01S 5/423 372/36 |
| 2013/0342835 A1 | 12/2013 | Blacksberg |
| 2014/0231630 A1 | 8/2014 | Rae et al. |
| 2014/0353471 A1 | 12/2014 | Raynor et al. |
| 2015/0163429 A1 | 6/2015 | Dai et al. |
| 2015/0200222 A1 | 7/2015 | Webster |
| 2015/0200314 A1 | 7/2015 | Webster |

OTHER PUBLICATIONS

Niclass et al., "A 0.18 um CMOS SoC for a 100m range, 10 fps 200×96 pixel Time of Flight depth sensor", IEEE International Solid-State Circuits Conference—(ISSCC), Session 27, Image Sensors, 27.6, pp. 488-490, Feb. 20, 2013.
Walker et al., "A 128×96 pixel event-driven phase-domain ΔΣ-based fully digital 3D camera in 0.13 μm CMOS maging technology", IEEE International Solid-State Circuits Conference—(ISSCC), Session 23, Image Sensors, 23.6, pp. 410-412, Feb. 23, 2011.
Mandai et al., U.S. Appl. No. 14/975,790, filed Dec. 20, 2015.
Pyper et al., U.S. Appl. No. 15/145,828, filed May 4, 2016.
Lin et al., U.S. Appl. No. 15/019,981, filed Feb. 10, 2016.
Roscher., "Flip-Chip Integration of 2-D 850nm Backside Emitting Vertical Cavity Laser Diode Arrays", Annual Repo Optoelectronics Department, University of Ulm, 6 Pages, 2002.
U.S. Appl. No. 15/145,828 Office Action dated Dec. 20, 2016.
U.S. Appl. No. 15/145,828 Office Action dated Jun. 2, 2017.

* cited by examiner

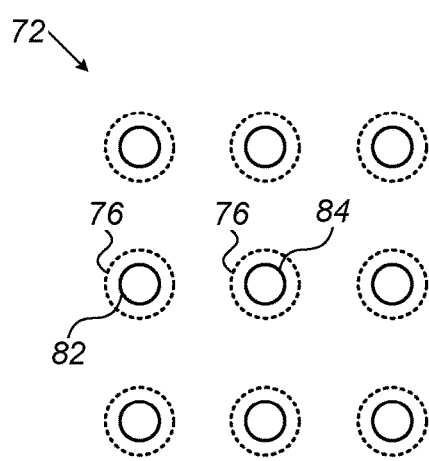
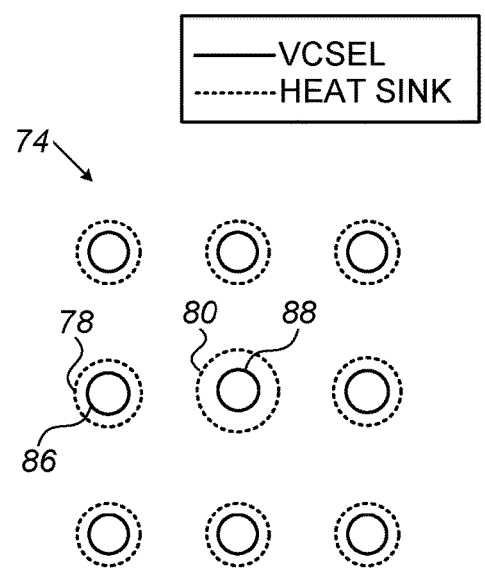
FIG. 4A
FIG. 4B

VCSEL STRUCTURE WITH EMBEDDED HEAT SINK

CROSS-REFERENCE TO RELATED APPLICATION

This application claims the benefit of U.S. Provisional Patent Application 62/194,298, filed Jul. 20, 2015, which is incorporated herein by reference.

FIELD OF THE INVENTION

The present invention relates generally to semiconductor devices, and particularly to optoelectronic devices and their manufacture.

BACKGROUND

Effective heat dissipation is one of the major challenges in design of high-power optoelectronic emitters, such as VCSELs. Such devices generate large amounts of heat in the emitter active regions, resulting in high emitter junction temperatures, which tend to reduce VCSEL efficiency and lead to a reduced optical power output at a given drive current, shift the emission wavelength, degrade the quality of the laser modes, and reduce operating lifetime and reliability. In VCSEL array devices, inefficient heat dissipation causes temperature non-uniformity among emitters, leading to variations in emitter optical power and wavelength across the array.

In some designs, the VCSEL chip is thinned substantially in order to reduce the thermal resistance between the emitter junction and the heat sink on the back side of the chip. For good heat dissipation, however, the chip must be made very thin (typically on the order of 100 μm or less), which weakens its mechanical strength and causes difficulties in handling both the semiconductor substrate and the chip, and in the packaging of the chip.

SUMMARY

Embodiments of the present invention that are described hereinbelow provide improved optoelectronic emitters and methods for their manufacture.

There is therefore provided, in accordance with an embodiment of the present invention, an optoelectronic device, which includes a semiconductor substrate, having front and back sides and having at least one cavity extending from the back side through the semiconductor substrate into proximity with the front side. At least one optoelectronic emitter is formed on the front side of the semiconductor substrate in proximity with the at least one cavity. A heat-conducting material at least partially filling the at least one cavity is configured to serve as a heat sink for the at least one optoelectronic emitter.

In a disclosed embodiment, the heat-conducting material in the optoelectronic device includes an electrically-conducting material, which serves the at least one optoelectronic emitter as an electrical contact.

In some embodiments, the at least one cavity is filled with at least two fill materials, wherein the at least two fill materials include an electrically-conductive film deposited over an interior surface of the at least one cavity in ohmic contact with the semiconductor substrate, and a thermally-conductive material deposited over the electrically-conductive film.

In some embodiments the at least one optoelectronic emitter includes an array of emitters on the front side of the semiconductor substrate, and the at least one cavity includes an array of cavities on the back side of the substrate, wherein the array of cavities is aligned with the array of emitters. Additionally or alternatively, the cavities have lateral dimensions that vary over the array proportionally to a local heat load over the array.

In the disclosed embodiments, the at least one optoelectronic emitter includes a vertical-cavity surface-emitting laser (VCSEL).

In still other embodiments, the optoelectronic device includes an etch stop layer deposited between the semiconductor substrate and the at least one optoelectronic emitter, wherein the at least one cavity extends through the semiconductor substrate to the etch stop layer.

There is also provided, in accordance with an embodiment of the present invention, a method for manufacturing an optoelectronic device. The method includes forming an optoelectronic emitter by deposition and patterning of epitaxial layers on a front side of a semiconductor substrate, etching a cavity through a back side of the semiconductor substrate, so that the cavity extends through the substrate into proximity with the epitaxial layers of the optoelectronic emitter, and at least partially filling the cavity with a heat-conducting material so as to serve as a heat sink for the optoelectronic emitter.

The present invention will be more fully understood from the following detailed description of the embodiments thereof, taken together with the drawings in which:

BRIEF DESCRIPTION OF THE DRAWINGS

FIGS. 4A-B are schematic top views of arrays of VCSELs and embedded heat sinks, in accordance with embodiments of the invention.

DETAILED DESCRIPTION OF EMBODIMENTS

Figure 1A:
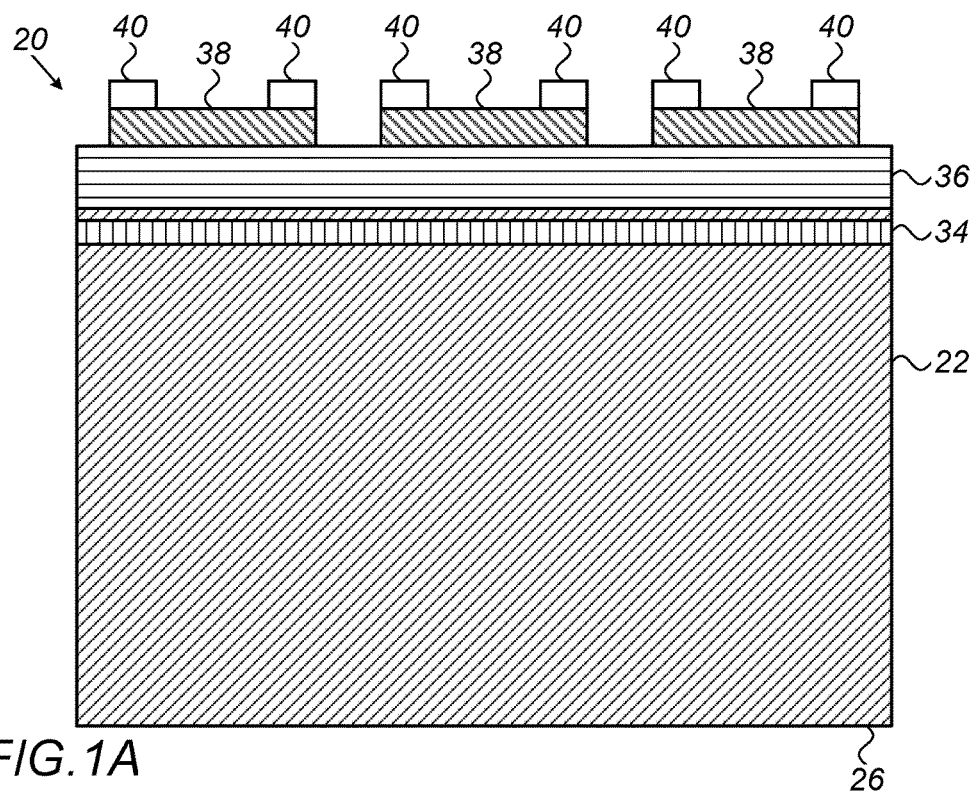
FIGS. 1A-C are schematic sectional illustrations of a VCSEL array with embedded heat sinks at different stages of the manufacturing of the array, in accordance with an embodiment of the invention.

Reducing thermal resistance for more effective heat dissipation is a major challenge in high power VCSELs. In addition, lowering the electrical resistance in the current path of the VCSEL is useful in further reducing power consumption and heat generation.

Embodiments of the present invention that are described herein provide a new VCSEL structure with embedded heat sink, which enhances heat dissipation without compromising mechanical strength. After moderate thinning of the VCSEL wafer, cavities, such as vias or trenches, are etched into the back side of the chip, extending from the back side through the substrate almost all of the way to the epitaxial layers below the VCSEL emitters. These cavities are then filled with metal or another material with high thermal conductivity (i.e., substantially higher conductivity than that of the semiconductor substrate), thus creating pillars through the substrate that serve as embedded heat sinks in the VCSEL chip. The thermal resistance between these embedded heat sinks and the emitters is low, thus facilitating efficient heat dissipation without compromising mechanical strength. If filled with metal, the pillars can also serve as electrodes for driving the VCSELs.

Typically, the embedded heat sinks are positioned directly under the emitters in order to reduce emitter junction temperatures. In VCSEL arrays, the sizes, positions and densities of the heat sinks can be adjusted in order to control the temperature profile across the array. Thus, the embedded heat sinks not only reduce temperature, but also facilitate a more uniform temperature distribution and thus improve the uniformity of optical power and wavelength across the array.

The embodiments of the present invention that are described herein provide a method for forming efficient, embedded heat sinks for VCSELs. The method comprises forming cavities, such as vias or trenches, from the back side of the semiconductor substrate (also referred to as a semiconductor wafer) carrying the VCSELs, with the cavities reaching close to the epitaxial layers of the VCSELs, and filling the cavities with material possessing thermal conductivity substantially higher than that of the semiconductor substrate. When the fill material also possesses high electrical conductivity, the filled cavities will, in addition to conducting heat away from the VCSELs, also serve as electrical contacts to these VCSELs. Heat sinks comprising materials that are electrically insulating may be made in a substantially identical fashion.

The method uses standard semiconductor processing techniques and is compatible as an add-on to existing VCSEL array designs and manufacturing methods. The embedded heat sinks and the methods for their manufacturing are applicable to substantially all common top-emitting VCSEL structures, such as etched mesa, proton-implanted, dielectric-apertured, and buried heterostructure designs. The techniques described herein can be used in manufacturing both VCSEL arrays and singlets, including both long-wavelength and short-wavelength VCSELs based on various semiconductor materials, including GaAs, InP, ZnSe, and GaN, inter alia.

In the disclosed embodiments, an array of VCSELs is formed on the front side of a semiconductor substrate using standard processes of epitaxial layer growth and patterning, after which the back side of the substrate is moderately thinned. An array of cavities, such as vias or trenches, is then defined by photolithography on the back side of the thinned substrate, followed by an appropriate etching process (either dry etch or wet etch) to create the cavities. The etched cavities are fully or partially filled with metal or another appropriate heat-conducting material to create embedded heat sinks under the emitters that were formed in previous process steps on the front side of the substrate. These steps are followed by standard process steps of substrate demounting, annealing, dicing, and chip packaging, as are known in the art.

The cavities that contain the embedded heat sinks can have either straight or tapered profiles, and their lateral dimensions can be smaller than, the same as, or larger than the VCSEL emitters themselves. (By lateral dimensions we are referring to the dimensions parallel to the front and back surfaces of the semiconductor substrate.) The cavities are typically, but not necessarily, aligned with the positions of the VCSEL emitters. Such alignment effectively brings the heat sink and back-side electrodes closer to the VCSEL emitter active regions, thus reducing both the thermal resistance and the electrical resistance between the emitters and the embedded heat sinks/electrodes.

For further reduction of thermal and electrical resistance between the heat sink and the VCSEL, it is desirable that the inner ends of the embedded heat sinks be as close as possible to the active areas of the VCSELs, without disturbing their distributed Bragg reflector (DBR) structures. To control the separation between the inner ends of the embedded heat sinks and the epitaxial layers of the VCSELs, an etch-stop layer may be formed on the semiconductor substrate before depositing the epitaxial layers. The etch-stop layer will ensure that the cavities are not etched too deeply.

To prevent thermal stresses in the chip, it is also desirable that the material that is used to fill the cavities for the embedded heat sinks have a coefficient of thermal expansion that is similar to that of the semiconductor substrate.

Multiple materials and multiple layers can be used in filling the cavities in order to achieve both good thermal conductivity and good ohmic contact. For example, a thin metal layer may be deposited on the inside walls of the cavities for good ohmic contact, with the choice of metal depending on the choice of semiconductor substrate, followed by partial or complete filling with a thicker heat-conducting layer. Alternatively, a thick metal layer with both good thermal and electrical conductivity, such as gold or copper, for example, can be used as both heat sink and electrode. Standard plating and sputtering processes may be used in applying the metal layer or layers.

It is desirable that all individual VCSELs in an array have the same output of radiative power. As the output of an individual VCSEL depends, among other factors, on its temperature, which in turn depends on the thermal environment of the VCSEL, the embedded heat sink array provides a way to even out the temperature differences between the individual VCSELs. The positions, lateral dimensions, and/or other features of the pattern of the embedded heat sinks can be varied in order to achieve uniform temperature distribution in the VCSEL array. For example, due to the fact that the center of a chip with a VCSEL array usually has a poorer heat dissipation than the edge of the chip, an increase of the lateral dimensions of the embedded heat sinks from the edge of chip towards its center may be used to compensate for the heat dissipation imbalance, achieving a more uniform VCSEL array temperature distribution.

Although the embodiments described herein and shown in the figures relate specifically to VCSELs, and particularly to VCSEL arrays, the principles of the present invention may similarly be applied in the design of other sorts of integrated high-power emitters.

Figure 1B:
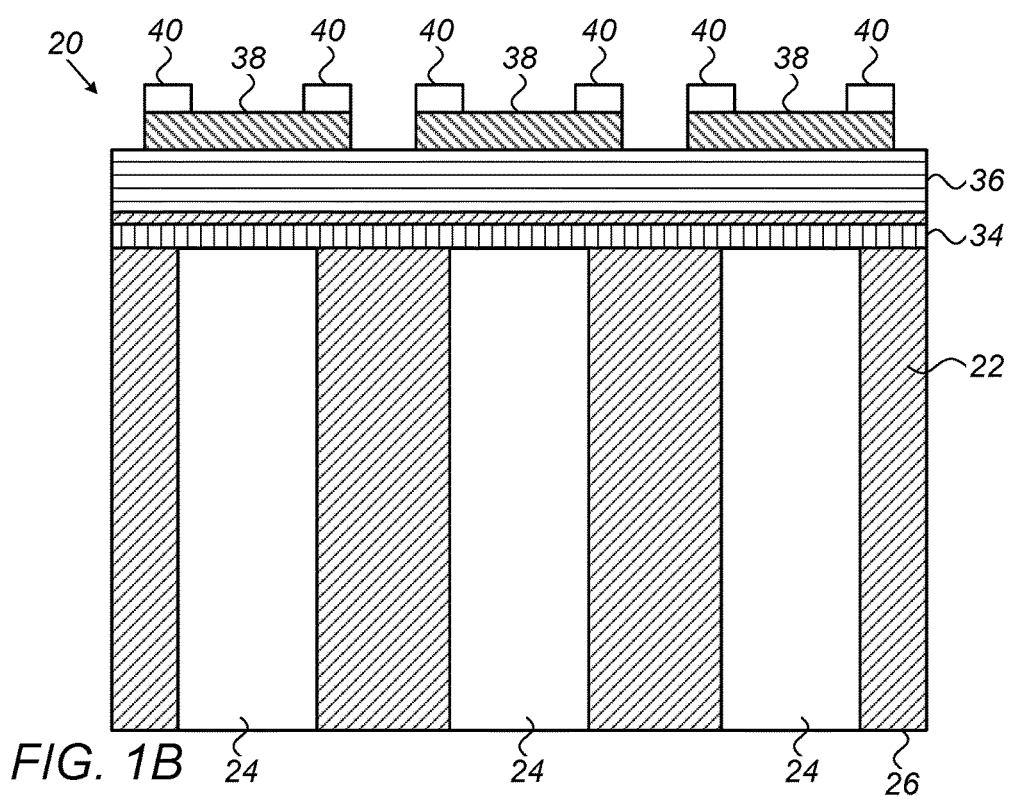
Figure 1C:
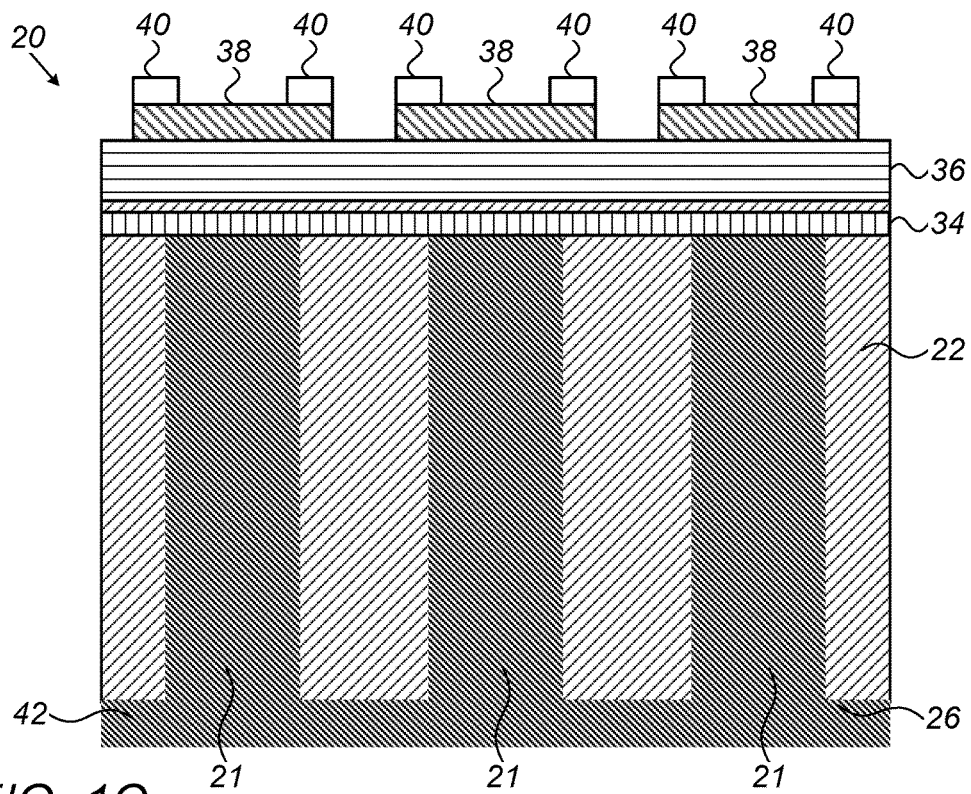

FIGS. 1A-C are schematic sectional views of a VCSEL array 20 with embedded heat sinks 21 at different stages of manufacture, in accordance with an embodiment of the invention. FIG. 1A shows VCSEL array 20 formed on a semiconductor substrate 22. FIG. 1B shows VCSEL array 20 after the photolithographic definition and etching of an array of cavities 24 in a back side 26 of substrate 22. FIG. 1C shows VCSEL array 20 after filling the cavities with a heat-conducting fill material, forming heat sinks 21. In the schematic sectional illustration of FIGS. 1A-C, as well as in subsequent illustrations, the dimensions of the features are not to scale.

As illustrated in FIG. 1A, VCSEL array 20 is manufactured, using standard semiconductor processes, on semiconductor substrate 22, starting with an epitaxially deposited etch stop layer 34 and continuing with an epitaxially deposited multilayer 36. Three individual emitters 38, as well as their front-side drive electrodes 40, are formed over epitaxial layer 36. In FIG. 1A, semiconductor substrate 22 is shown after the process step of thinning back side 26, and consequently the same thickness of substrate is shown in subsequent FIGS. 1B-C.

In FIG. 1B, cavities 24 have been defined by photolithography from back side 26 of substrate 22 so as to be aligned with emitters 38. After photolithographic definition, cavities 24 are etched using standard semiconductor processes to a depth reaching close to epitaxial layers 36, without however encroaching on these layers. Etch depth of cavities 24 is controlled by the use of etch-stop layer 34 formed on substrate 22 before depositing epitaxial layers 36.

As shown in FIG. 1C, cavities 24 are filled with heat-conducting material, forming heat sinks 21. Heat sinks 21 are aligned with emitters 38, with the tops of heat sinks 21 brought into close proximity with epitaxial layers 36. The alignment with emitters 38 and proximity to epitaxial layer 36 is designed for providing efficient cooling to emitters 38, as well as for providing low ohmic losses when heat sinks 21 also serve as back-side electrodes to emitters 38. Additional heat-conducting material has been deposited over back side 26 as an unpatterned, continuous film 42, serving as a common back-side electrode of VCSEL array 20.

Figure 2A:
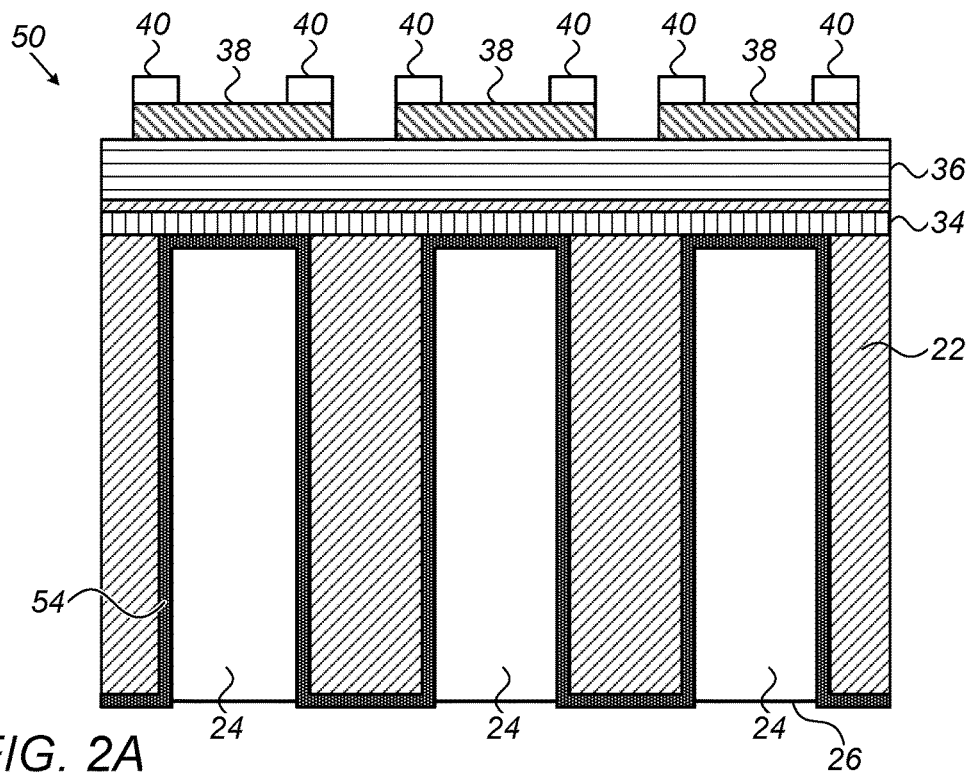
FIGS. 2A-B are schematic sectional illustrations of a VCSEL array with embedded heat sinks at different stages of the manufacturing of the array, in accordance with another embodiment of the invention.
Figure 2B:
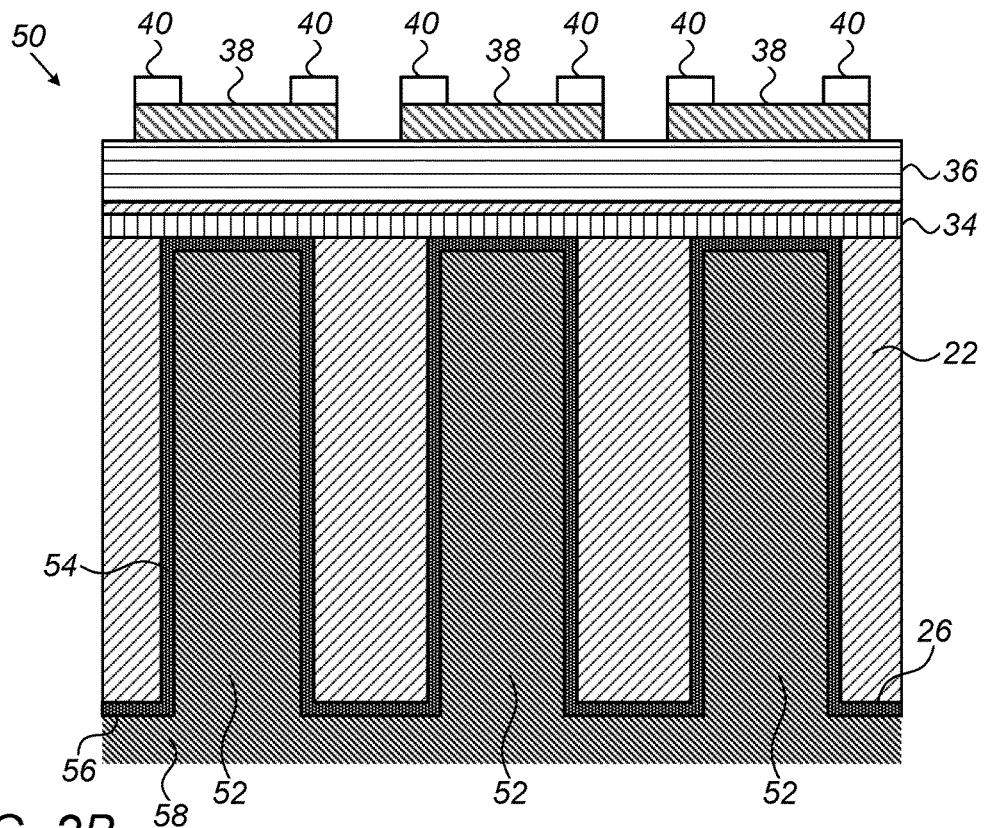

FIGS. 2A-B are schematic sectional views of a VCSEL array 50 with embedded heat sinks 52 at different stages of manufacture, in accordance with another embodiment of the invention. In contrast to the preceding embodiment, cavities 24 in array 50 are lined with a metal layer 54 for ohmic contact. In other respects, array 50 is produced in a similar manner to array 20.

As shown in FIG. 2A, cavities 24 are, after etching, coated with metal film 54, for example, by depositing a thin metal layer on the inner cavity surfaces, which serves as an ohmic contact to the semiconductor material of substrate 22. A metal film 56, as a continuation of metal film 54, is deposited on back side 26 for ohmic contact.

In FIG. 2B, cavities 24, coated by metal film 54, are filled with heat conducting fill material, forming heat sinks 52 for emitters 38. The combination of metal film 54, providing ohmic contact, and the heat conducting material forming heat sinks 52 serves as an array of back-side electrodes to emitters 38. As in FIG. 1C, additional heat-conducting material has been deposited to form unpatterned, continuous film 58 on back side 26, serving as a common back-side electrode of VCSEL array 20.

It will be appreciated that in some embodiments the shapes and relative dimensions as well as the alignment of heat sinks 21 are different from those shown in the above figures.

Figure 3:
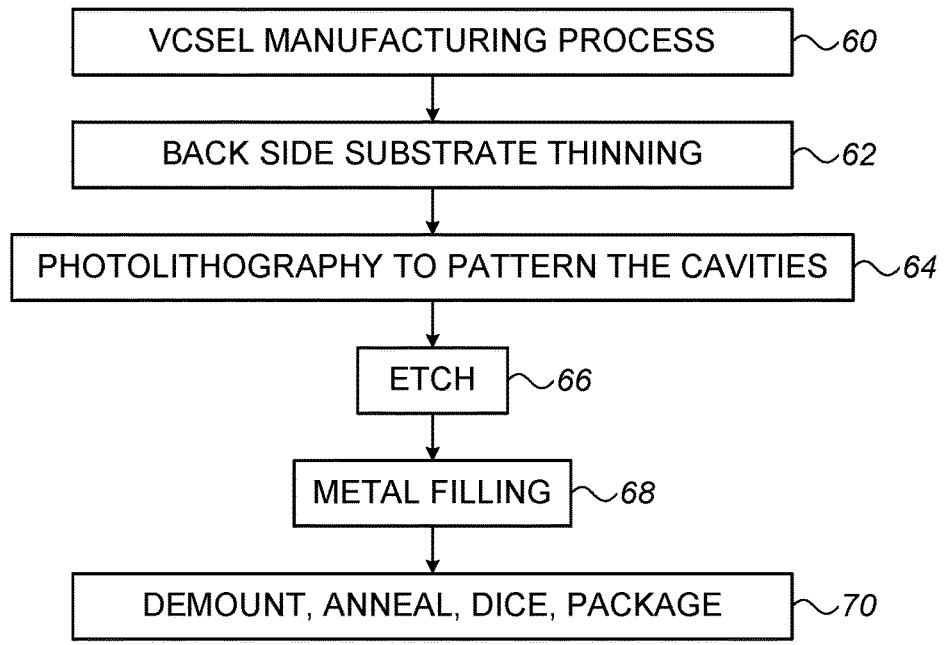
FIG. 3 is a flowchart that schematically illustrates a manufacturing process of a VCSEL array with embedded heat sinks, in accordance with an embodiment of the invention.

FIG. 3 is a flowchart that schematically illustrates the manufacturing process of VCSEL array 20 (FIGS. 1A-C) with embedded heat sinks 21, in accordance with an embodiment of the invention. A similar process can be applied, mutatis mutandis, in producing array 50 (FIGS. 2A-B). VCSEL array 20 itself is manufactured in a fabrication step 60. In a thinning step 62, semiconductor substrate 22 is moderately thinned from back side 26 (FIG. 1A). Steps 60 and 62 are typically carried out using techniques of thin film deposition, lithographic patterning, and wafer processing that are known in the art.

In a patterning step 64, cavities 24 (FIG. 1B) are photolithographically defined on back side 26 of substrate 22. Cavities 24 are etched through the back side of the substrate, using dry or wet etching techniques that are known in the art, in an etching step 66. The cavities are then filled with a metal or other thermally conductive material to form heat sinks 21 (FIG. 1C), for example by plating or sputtering, in a filling step 68. Further in step 68, unpatterned film 42 is formed over the back side of the substrate. Step 68 may involve only a single-material filling, as in FIG. 1C, or separate coating by metal film 56 for ohmic contact, followed by filling with thermal conducting material for embedded heat sinks 52, as in FIGS. 2A-B.

After fabrication of heat sinks 21, substrate 22 is demounted, annealed, diced, and packaged in a process completion step 70, using standard semiconductor manufacturing techniques. In process completion step 70, film 42 of FIG. 1C (or film 58 of FIG. 2B) is typically brought to contact with an external heat sink and/or electrical conductors (not shown).

FIGS. 4A-B are schematic top views of respective arrays 72 and 74 of VCSELs and embedded heat sinks, in accordance with embodiments of the invention. These figures compare an embodiment in which embedded heat sinks have uniform lateral dimensions (FIG. 4A) to an embodiment in which the lateral dimensions of embedded heat sinks 78, 80 are adjusted according to the thermal environment of the VCSEL which each heat sink 78, 80 is cooling (FIG. 4B). The lateral dimensions of the VCSELs and heat sinks are shown schematically as circles, with VCSELs denoted by a solid line and heat sinks denoted by a dotted line.

As shown in FIG. 4A, array 72 comprises VCSELs 82, 84 and their associated heat sinks 76 aligned with the respective VCSELs. Although in FIG. 4A heat sinks 76 are shown as vias, in some embodiments the heat sinks have a different design, for example a trench-like design. In VCSEL array 72, all heat sinks 76 have the same lateral dimensions and consequently the same thermal conductance. As VCSEL 84 inside array 72 is surrounded by additional VCSELs 82, its temperature may be higher than that of the surrounding VCSELs, with a possible detrimental impact on its performance, as has been previously described.

In FIG. 4B, array 74 comprises VCSELs 86, 88 and their associated heat sinks 78, 80. In this embodiment, the lateral dimensions of individual heat sinks 78, 80 have been adjusted for the individual VCSEL environment and vary in proportion to the local heat load across array 74. VCSELs 86 at the edge of array 74 have heat sinks 78 with the same lateral dimensions as the other heat sinks at the edge of array 74. However, as opposed to array 72, heat sink 80 aligned with VCSEL 88, located in an inside position in array 74, has lateral dimensions larger than that of heat sinks 78, aligned with VCSELs 86 on the edge. Consequently, the thermal conductance of heat sink 80 is higher than that of heat sinks 78, and heat sink 80 will cool VCSEL 88 more efficiently than a heat sink of smaller lateral dimensions would. The different dimensions of heat sinks 78 and 80 are chosen so as to ensure that the temperature of VCSEL 88 is similar to that of the surrounding VCSELs 86. By the same token, as shown in FIG. 4B, the heat sinks of the VCSELs at the corners of array may have smaller dimensions than those at the edges.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
a semiconductor substrate, having front and back sides and having at least one cavity extending from the back side through the semiconductor substrate into proximity with the front side;
at least one optoelectronic emitter formed on the front side of the semiconductor substrate in proximity with the at least one cavity; and
a heat-conducting material at least partially filling the at least one cavity and configured to serve as a heat sink for the at least one optoelectronic emitter.

2. The optoelectronic device according to claim 1, wherein the heat-conducting material comprises an electrically-conducting material, which serves the at least one optoelectronic emitter as an electrical contact.

3. The optoelectronic device according to claim 1, wherein the at least one cavity is filled with at least two fill materials.

4. The optoelectronic device according to claim 3, wherein the at least two fill materials comprise an electrically-conductive film deposited over an interior surface of the at least one cavity in ohmic contact with the semiconductor substrate, and a thermally-conductive material deposited over the electrically-conductive film.

5. The optoelectronic device according to claim 1, wherein the at least one optoelectronic emitter comprises an array of emitters on the front side of the semiconductor substrate, and the at least one cavity comprises an array of cavities on the back side of the substrate, wherein the array of cavities is aligned with the array of emitters.

6. The optoelectronic device according to claim 5, wherein the cavities have lateral dimensions that vary over the array.

7. The optoelectronic device according to claim 6, wherein the lateral dimensions of the cavities in the array vary proportionally to a local heat load over the array.

8. The optoelectronic device according to claim 1, wherein the at least one optoelectronic emitter comprises a vertical-cavity surface-emitting laser (VCSEL).

9. The optoelectronic device according to claim 1, and comprising an etch stop layer deposited between the semiconductor substrate and the at least one optoelectronic emitter, wherein the at least one cavity extends through the semiconductor substrate to the etch stop layer.

10. A method for manufacturing an optoelectronic device, the method comprising:
forming an optoelectronic emitter by deposition and patterning of epitaxial layers on a front side of a semiconductor substrate;
etching a cavity through a back side of the semiconductor substrate, so that the cavity extends through the substrate into proximity with the epitaxial layers of the optoelectronic emitter; and
at least partially filling the cavity with a heat-conducting material so as to serve as a heat sink for the optoelectronic emitter.

11. The method according to claim 10, wherein the heat-conducting material comprises an electrically-conducting material, which serves the optoelectronic emitter as an electrical contact.

12. The method according to claim 10, wherein at least partially filling the cavity comprises filling the cavity with at least two fill materials.

13. The method according to claim 12, wherein filling the cavity comprises depositing an electrically-conductive film over an interior surface of the cavity in ohmic contact with the semiconductor substrate, and depositing a thermally-conductive material over the electrically-conductive film.

14. The method according to claim 10, wherein forming the optoelectronic emitter comprises forming an array of emitters on the front side of the semiconductor substrate, and wherein etching and at least partially filling the cavity comprises forming multiple heat sinks in alignment with the emitters in the array.

15. The method according to claim 14, wherein forming the multiple heat sinks comprises forming the heat sinks with lateral dimensions that vary over the array.

16. The method according to claim 15, wherein the lateral dimensions of the heat sinks vary proportionally to a local heat load over the array.

17. The method according to claim 10, wherein the optoelectronic emitter comprises a VCSEL.

18. The method according to claim 10, wherein forming the optoelectronic emitter comprises depositing an etch stop layer between the semiconductor substrate and the optoelectronic emitter, and wherein etching the cavity comprises etching through the semiconductor substrate to the etch stop layer.

* * * * *